United States Patent

Dick

[11] Patent Number: 5,818,279
[45] Date of Patent: Oct. 6, 1998

[54] CIRCUIT ARRANGEMENT COMPRISING A LOGARITHMIC TRANSFER FUNCTION

[75] Inventor: Burkhard Dick, Hamburg, Germany

[73] Assignee: U.S. Philips Corporation, New York, N.Y.

[21] Appl. No.: 812,190

[22] Filed: Mar. 6, 1997

[30] Foreign Application Priority Data

Mar. 7, 1996 [DE] Germany ............... 196 08 861.5

[51] Int. Cl.$^6$ .................................. H03G 11/08
[52] U.S. Cl. ........................... 327/350; 327/352
[58] Field of Search ................... 327/350, 351, 327/352, 560, 563

[56] References Cited

U.S. PATENT DOCUMENTS

| | | | |
|---|---|---|---|
| 4,442,549 | 4/1984 | Main | 327/350 |
| 4,972,512 | 11/1990 | Garskamp | 327/350 |
| 5,345,185 | 9/1994 | Gilbert | 327/350 |
| 5,561,392 | 10/1996 | Kimura | 327/350 |

Primary Examiner—Toan Tran
Attorney, Agent, or Firm—Jack D. Slobod

[57] ABSTRACT

A circuit arrangement having a logarithmic transfer function between an input signal and an output signal in a predefined level range of the input signal circuit which has a very low power consumption and low circuit complexity, includes a first pair of amplifier elements, namely transistors, forming a first differential amplifier and a second pair of amplifier elements, namely transistors, forming a second differential amplifier. The first pair of transistors have their emitters connected to each other and to a first current source, their collectors connected to working impedances subdivided by respective taps, and their bases receive the input signal between them. The second pair of transistors have their emitters connected to each other and to a second current source, their collectors connected to the collectors of the first pair of transistors, respectively, and their bases cross-connected to the taps of the working impedances. A rectifier stage has inputs connected to the collectors of the first and second pairs of transistors and an output at which the output signal is formed.

20 Claims, 3 Drawing Sheets

CIRCUIT ARRANGEMENT COMPRISING A LOGARITHMIC TRANSFER FUNCTION

BACKGROUND OF THE INVENTION

The invention relates to a circuit arrangement comprising a logarithmic transfer function.

In receiver circuits, for example, for pagers, arrangements are needed for controlling certain functions such as the mute mode, the indication of signal levels or the automatic gain control, by which arrangements the field strength of received signals (voltages, signal level) can be detected. Field strength detectors or voltage detectors used in this respect generally have a logarithmic transfer function between the (antenna) signal supplied thereto and their output signal, which output signal represents a measure for the detected field strength or voltage respectively. This means that when the input field strength or input voltage respectively, is plotted logarithmically against a linear representation of the output voltage of the detector, a substantially linear characteristic curve evolves in the diagram.

Such a diagram is shown in FIG. 1. The abscissa therein shows an input voltage Ue in a logarithmic scale. Along the ordinate in FIG. 1 is shown the associated output voltage Ua in a linear scale. In the level range between the input voltages Ue1 and Ue2 there is a characteristic curve in linear representation, i.e. a straight line, which represents a logarithmic relation between the input voltage Ue and the output voltage Ua, i.e. a logarithmic transfer function between these two voltages. The control region for the input voltage Ue when the voltage detector is in operation lies preferably between the voltage limits Ue1 and Ue2. FIG. 1 shows in this respect the transfer function of an ideal field strength detector or voltage detector, respectively.

FIG. 2 shows a possibility for an embodiment of a voltage detector which has a transfer function as shown in FIG. 1. This circuit arrangement comprises a plurality of correspondingly dimensioned differential amplifier stages 1, 2, . . . n formed each by an emitter-coupled transistor pair 11, 12; 21, 22; . . . ; n1, n2, a respective emitter current source 13, 23, . . . , n3 feeding each transistor pair and, for each of the transistors 11, 12; 21, 22; . . . ; n1, n2 a collector resistance 14, 15; 24, 25; . . . , n4, n5 led to a shared power supply terminal 100. The base terminals of the individual transistor pairs 11, 12; . . . n1, n2 form input terminals of the differential amplifier stages 1, . . . n, the collector terminals of these transistor pairs forming output terminals of the differential amplifier stages 1, . . . n. The differential amplifier stages 1, . . . , n are connected to each other as a ladder network. The input of the first differential amplifier stage 1 is supplied with the input voltage Ue. The collector resistances 14, 15 of the first differential amplifier stage 1 have the resistance value R1, the collector resistances 24, 25 of the second differential amplifier stages 2 the resistance value R2, and so on; accordingly, the resistance values of the collector resistances n4, n5 of the $n^{th}$ differential amplifier stage n are selected to be Rn. The emitter current sources 13, 23, . . . , n3 produce the direct currents I1, I2, . . . , In, respectively. The following dimensioning holds R1=R2= . . . =Rn and I1=I2= . . . =In i.e. all the differential amplifier stages 1, 2, . . . , n have the same dimensioning, thus have the same gain and the same operating points.

The output signals of the differential amplifier stages 1, 2, . . . n are furthermore connected each to a rectifier stage 16, 17, . . . , n5, respectively. Their (rectified) output signals are linearly added together in an adding circuit 101 and the sum is produced as output voltage Ua.

In the circuit arrangement shown in FIG. 2 the voltage range for the input voltage Ue between the voltage limits Ue1 and Ue2 depends on the number n of differential amplifier stages 1, 2, . . . , n. However, there must be at least two differential amplifier stages available.

The use of a circuit arrangement as shown in FIG. 2, however, is very limited. For example, if the individual differential amplifier stages 1, 2, . . . , n are dimensioned differently, or if each of the differential amplifier stages 1, 2, . . . , n is followed by a respective high-pass filter, i.e. inserted into the ladder network, the circuit arrangement thus formed can no longer be used for obtaining a logarithmic characteristic curve.

On the other hand, the circuit arrangement shown in FIG. 2 represents a circuit complexity which, particularly for devices to be operated with low-capacity batteries, exceeds the limits of what is justifiable. This practically eliminates a use, for example, in a pager operating on a low battery voltage or in devices having comparable requirements as to energy supply and compact structure. The circuit arrangement shown in FIG. 2 does not satisfy the strict requirements made here with respect to a low power consumption and low circuit complexity. This circuit complexity would only be permitted to the extent of a differential amplifier stage 1, 2, . . . , n in combination with an associated rectifier stage 16, 26, . . . , n6, respectively. With this limitation (n=1), the circuit arrangement shown in FIG. 2 does not provide the desired transfer function, however.

OBJECTS AND SUMMARY OF THE INVENTION

It is an object of the invention to provide a circuit arrangement having a logarithmic transfer function, which arrangement can be used, for example, as a voltage detector and has a very low power consumption and a very low circuit complexity.

This object is achieved according to the invention by a circuit arrangement comprising a logarithmic transfer function between an input signal and an output signal within a predefined level range of the input signal, comprising a pair of amplifier elements forming a first differential amplifier the main current paths of which amplifier elements are connected, on the one hand, to each other and to a first current source and on the other hand, to working impedances subdivided by respective taps, and the control terminals of which amplifier elements are supplied with the input signal, a pair of amplifier elements forming a second differential amplifier, the main current paths of which amplifier elements are connected, on the one hand, to each other and to a second current source and on the other hand, to the connections of the main current paths of the first differential amplifier and the working impedances, and whose control terminals are cross-connected to the taps of the working impedances, and a rectifier stage whose input is connected to the connections of the main current paths of the differential amplifiers and the working impedances and whose output signal is tapped from its output.

DETAILED DESCRIPTION OF THE PREFERRED EMBODIMENTS

Figure 1:
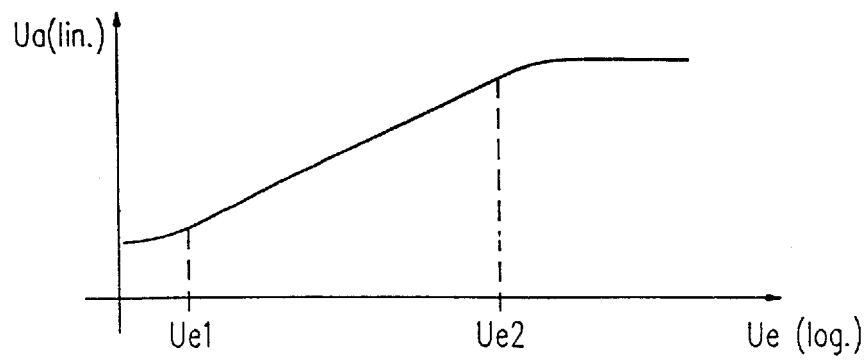
FIG. 1 is an idealized plot of output voltage Uo versus input voltage Ue having a logarithmic transfer function, where Ue is shown in a logarithmic scale.
Figure 2:
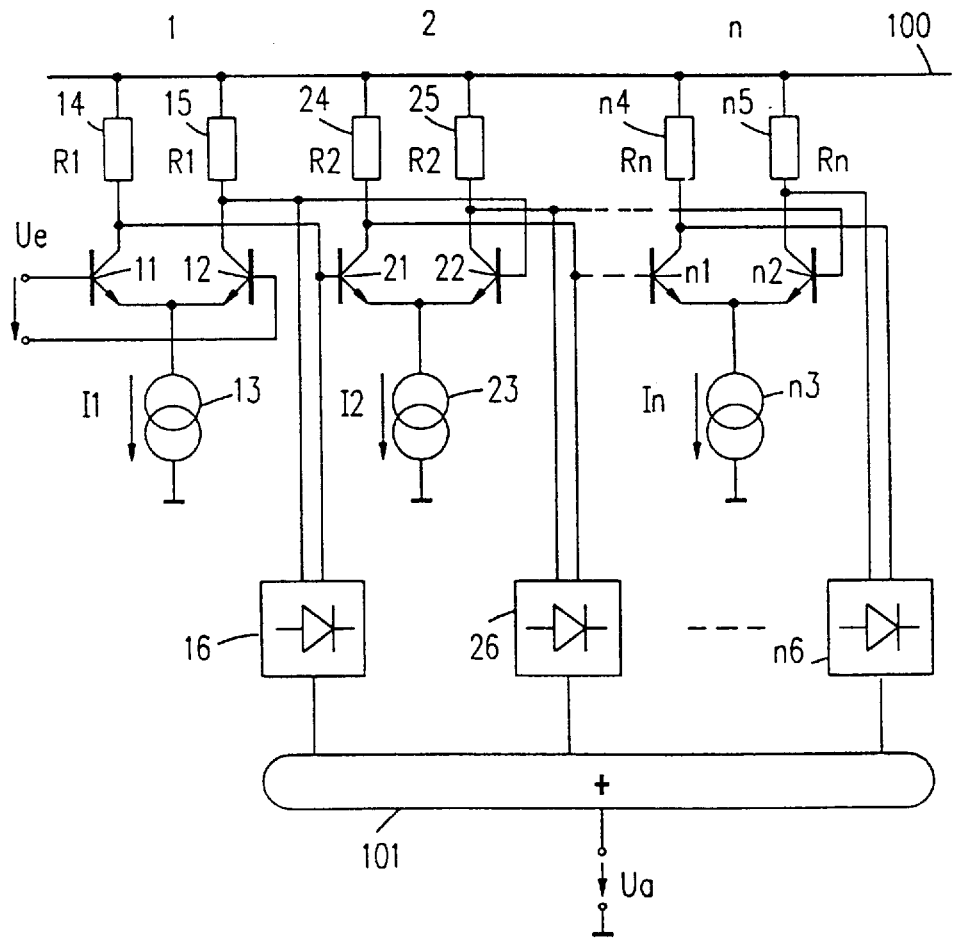
FIG. 2 is a circuit diagram of a prior art arrangement generally having the transfer function shown in FIG. 1.
Figure 3:
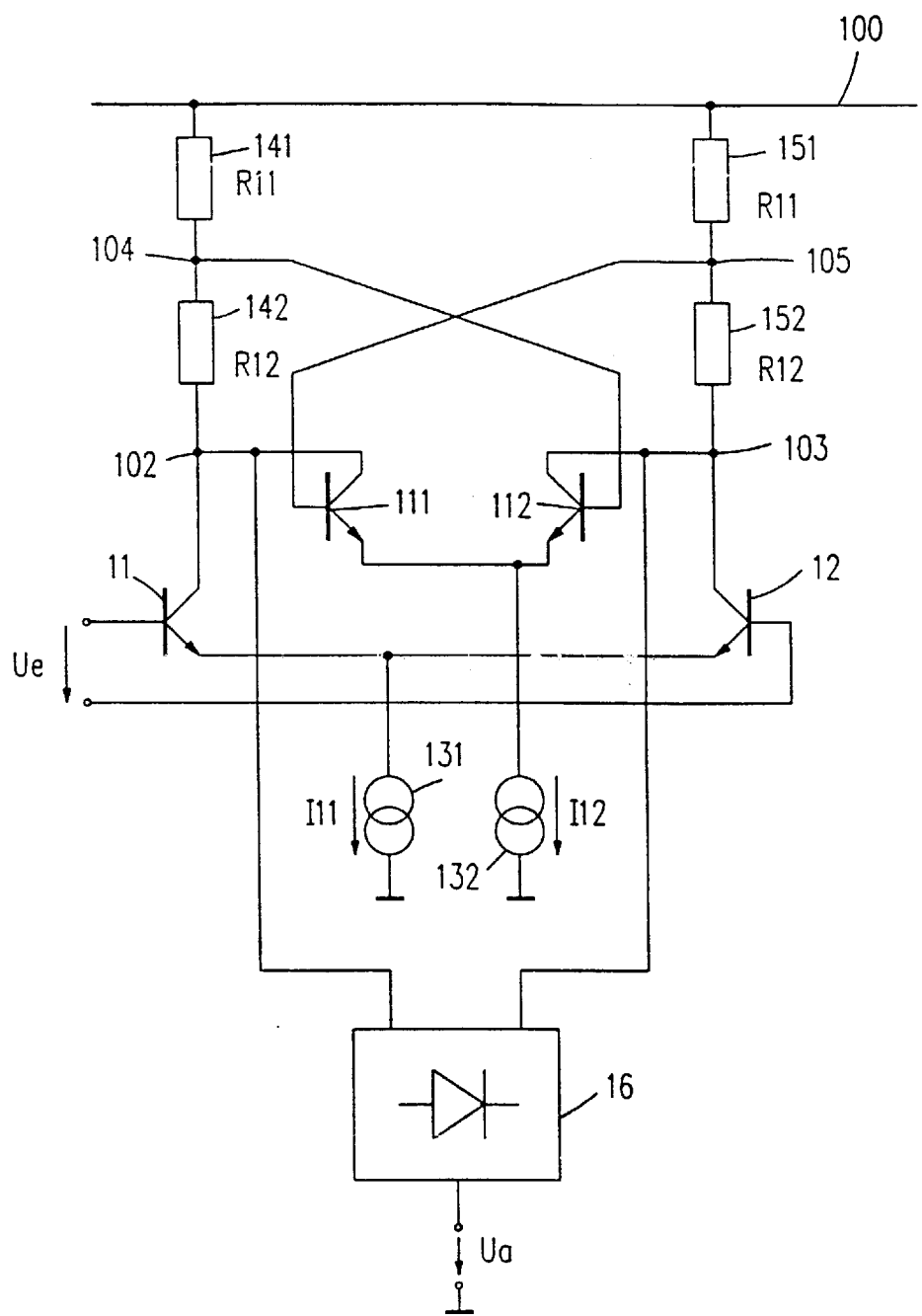
FIG. 3 is a circuit diagram of an arrangement in accordance with the present invention.

An exemplary embodiment with reference to which the invention may also be explained in general is shown in FIG. 3. A basic structure of this embodiment for the circuit arrangement according to the invention is derived from one of the differential amplifier stages 1, 2, . . . n of FIG. 2; accordingly, comparable or identical elements have like reference characters.

Compared to one of the differential amplifier stages 1, 2, . . . , n of FIG. 2—the first differential amplifier stage 1 being taken as an example in the following—the circuit arrangement according to the invention comprises a further transistor pair 111, 112, which is also structured in the form of an (emitter coupled) differential amplifier which is supplied with the direct current I12 by an emitter current source 132. In lieu of the emitter current source 13 of the differential amplifier stage 1 of FIG. 2, an emitter current source 131 occurs having a direct current I11. The terminals facing away from the emitter current sources 131, 132 of the main current paths of the transistor pair 111, 112, in the example shown in FIG. 3 they are the collector terminals of the transistor pair 111, 112, are connected to nodes 102 and 103 respectively, in which nodes are connected the main current paths of the transistor pair 11, 12 having the associated collector resistances and which nodes represent output terminals of the differential amplifier formed by the transistor pair 11, 12. The collector resistances 14, 15 of the differential amplifier stage 1 in FIG. 2, i.e. the working impedances of the transistor pair 11, 12, are subdivided according to the invention by a tap 104, 105 respectively. The cross-connections of the transistor pair 111, 112 are connected to these taps 104, 105.

In this manner, the circuit complexity according to the invention is only slightly higher than for one of the differential amplifier stages 1, 2, . . . , n shown in FIG. 2.

Compared to the differential amplifier stage 1 shown in FIG. 2, the working impedances divided each into sub-resistances 141, 142 and 151, 152 respectively, take the place of the collector resistances 14, 15. The sub-resistances 141, 151 have a resistance value R11 and the sub-resistances 142, 152 a resistance value R12. These resistance values may preferably be selected so that their sum R11+R12 corresponds to the resistance value R1, which a collector resistance 14, 15 respectively, of a circuit arrangement as shown in FIG. 2 would have. Accordingly, the sum of the d.c. currents I11+I12 of the emitter current sources 131 and 132 and the d.c. current I1 of the emitter current source 13 of FIG. 2 may preferably be selected to be the same. In that case, no additional power consumption is caused by the circuit arrangement according to the invention compared with the differential amplifier stage 1, 2, . . . , n respectively, of FIG. 2.

The connection of the first and second differential amplifiers of the circuit arrangement according to the invention has (with respect to the nodes 102, 103 in FIG. 3) an output impedance which depends on the input signal (input voltage Ue). The consequence non-linearity between the input signal and the output signal accurately produces the logarithmic transfer function. The degree to which an exact logarithmic transfer function is approximated is decisively determined by the ratio of the values of the d.c. currents (I11, I12 respectively) produced by the first and the second current sources (131, 132 respectively, in FIG. 3). While assuming a certain ratio, the exact logarithmic transfer function may thus be approximated most accurately. The accuracy turns out to be larger as the ratio of the value of the d.c. current (I11) of the first current source (131) to that of the second current source 132 is selected lower. Preferably, this ratio is fixed at a value of at least approximately 3. Choosing a smaller value for this ratio enhances the accuracy with which the logarithmic transfer function is obtained even more, but at the same time decreases thereby the stability of the circuit arrangement according to the invention. This means that the transfer function obtained for smaller values of said ratio is more logarithmic indeed, but that tolerances of the dimensioning of the individual circuit elements obtain more influence.

Figure 4:
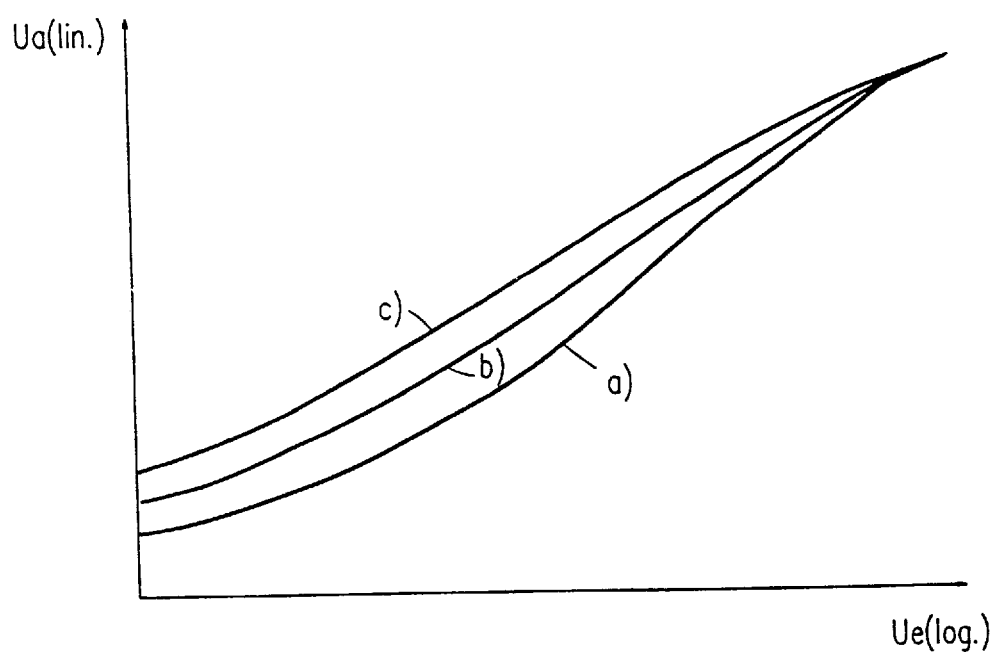
FIG. 4 are plots of output voltage Uo versus input voltage Ue for the arrangement shown in FIG. 3, with various different ratios of resistors therein.

FIG. 4 shows a comparison of three characteristics curves between the logarithmically shown input voltage Ue and the linearly shown output voltage Ua. Curve a) shows the behavior of one of the differential amplifier stages 1, 2, . . . , n of FIG. 2. FIG. b) shows by way of comparison the relation between the input voltage Ue and the output voltage Ua of the circuit arrangement according to the invention shown in the exemplary embodiment of FIG. 3, for the case where the ratio of the d.c. current I11 to the d.c. current I12 assumes the value 3. As against the case of curve a), curve b) in FIG. 4 shows a clearly linear variation which corresponds to an improved approximation of the exact logarithmic transfer function. Finally, for curve c) the above ratio of the currents I11 and I12 is set to the value 2. This again provides an improved approximation of the exact logarithmic variation of the transfer function compared with curve b).

Preferably, the first and second power sources (131, 132 in FIG. 3) and the working impedances (141, 142, 151, 152 in FIG. 3) are dimensioned so that even with the highest level of the input signal to be processed (input voltage Ue), saturation of the differential amplifier (11, 12; 111, 112) is avoided, but that the second differential amplifiers (111, 112) is slightly overloaded.

The circuit arrangement according to the invention may preferably be inserted into a logarithmic linearization stage. Such a linearization stage is preferably used in a level detector to obtain a more accurate characteristic curve and thus an improved detection accuracy. If such a level detector is used in an Automatic Gain Control (AGC), the function of this Automatic Gain Control would also become more precise. A preferred field of application for such circuit arrangements are pagers for which the exact mode of operation and the low power consumption with minimum circuit complexity is most favorable.

I claim:

1. A circuit arrangement having a logarithmic transfer function between an input signal and an output signal in a predefined level range of the input signal, comprising:

a pair of amplifier elements forming a first differential amplifier, main current paths of which amplifier elements are connected, on the one hand, to each other and to a first current source, and on the other hand, to working impedances subdivided by respective taps, and control terminals of which amplifier elements are for receiving the input signal between them;

a pair of amplifier elements forming a second differential amplifier, the main current paths of which amplifier elements are connected, on the one hand, to each other and to a second current source and on the other hand, to the connections of the main current paths of the first differential amplifier and the working impedances, and whose control terminals are cross-connected to the taps of the working impedances; and a rectifier stage whose input is connected to the connections of the main current paths of the differential amplifiers to the working impedances and whose output is for supplying said output signal.

2. A circuit arrangement as claimed in claim 1, wherein values of the currents produced by the first and second current sources have a predefined ratio to each other.

3. A circuit arrangement as claimed in claim 2, wherein the ratio of the value of the current produced by the first current source to the value of the current produced by the second current source is at most 3.

4. A circuit arrangement as claimed in claim 1, wherein the first and second current sources and the working impedances are dimensioned so that even with the largest level of the input signal to be processed a saturation of the first and second differential amplifiers is avoided, but that the second differential amplifier is slightly overloaded.

5. A circuit arrangement as claimed in claim 1, wherein said circuit arrangement is included in a logarithmic linearization stage.

6. A circuit arrangement as claimed in claim 5, wherein said logarithmic linearization stage is included in a level detector.

7. A circuit arrangement as claimed in claim 6, wherein said level detector is included in an automatic gain control.

8. A as claimed in claim 7, wherein said automatic gain control is included in a pager.

9. A circuit arrangement a claimed in claim 2, wherein the first and second current sources and the working impedances are dimensioned so that even with the largest level of the input signal to be processed a saturation of the first and second differential amplifiers is avoided, but that the second differential amplifier is slightly overloaded.

10. A circuit arrangement as claimed in claim 3, wherein the first and second current sources and the working impedances are dimensioned so that even with the largest level of the input signal to be processed a saturation of the first and second differential amplifiers is avoided, but that the second differential amplifier is slightly overloaded.

11. A circuit arrangement as claimed in claim 2, wherein said circuit arrangement is included in a logarithmic linearization stage.

12. A circuit arrangement as claimed in claim 3, wherein said circuit arrangement is included in a logarithmic linearization stage.

13. A circuit arrangement as claimed in claim 4, wherein said circuit arrangement is included in a logarithmic linearization stage.

14. A circuit arrangement as claimed in claim 9, wherein said circuit arrangement is included in a logarithmic linearization stage.

15. A circuit arrangement as claimed in claim 10, wherein said circuit arrangement is included in a logarithmic linearization stage.

16. A circuit arrangement as claimed in claim 11, wherein said logarithmic linearization stage is included in a level detector.

17. A circuit arrangement as claimed in claim 12, wherein said logarithmic linearization stage is included in a level detector.

18. A circuit arrangement as claimed in claim 13, wherein said logarithmic linearization stage is included in a level detector.

19. A circuit arrangement as claimed in claim 14, wherein said logarithmic linearization stage is included in a level detector.

20. A circuit arrangement having a logarithmic transfer function between an input signal and an output signal in a predefined level range of the input signal, comprising:

a first differential amplifier having a pair of input terminals for receiving the input signal between them, and a pair of output terminals;

a pair of working impedances each connected at one end to a different one of the output terminals of the first differential amplifier and connected at their other end to a power supply terminal, each of said working impedances being subdivided by a respective tap;

a second differential amplifier having a pair of input terminals cross-connected to the taps of different ones of the pair of working impedances, and a pair of output terminals connected to different ones of the output terminals of the first differential amplifier at respective first and second connections; and a rectifier stage having first and second inputs connected to the first and second connections, respectively, and having an output for supplying said output signal.

* * * * *